(12) United States Patent
Ito et al.

(10) Patent No.: US 6,248,009 B1
(45) Date of Patent: Jun. 19, 2001

(54) APPARATUS FOR CLEANING SUBSTRATE

(75) Inventors: Kenya Ito; Naoki Matsuda; Mitsuhiko Shirakashi; Fumitoshi Oikawa; Koji Ato, all of Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/506,320

(22) Filed: Feb. 18, 2000

(30) Foreign Application Priority Data

Feb. 18, 1999 (JP) .................................................. 11-039770

(51) Int. Cl.⁷ ....................................................... B24B 21/18
(52) U.S. Cl. ............................................. 451/444; 451/443
(58) Field of Search .................................. 451/41, 56, 63, 451/66, 109, 110, 178, 446, 443, 60; 15/88.4, 102, 256.5, 256.51, 21.1, 88.1, 88.2, 88.3, 77; 134/104.1

(56) References Cited

U.S. PATENT DOCUMENTS

| | | | |
|---|---|---|---|
| 5,616,069 | * 4/1997 | Walker et al. | 451/444 |
| 5,639,311 | 6/1997 | Holley et al. | |
| 5,779,526 | * 7/1998 | Gill | 451/444 |
| 5,806,126 | 9/1998 | de Larios et al. | |
| 5,860,181 | 1/1999 | Mackawa et al. | |
| 6,086,460 | * 7/2000 | Labunsky et al. | 451/444 |
| 6,139,406 | * 10/2000 | Kennedy et al. | 451/444 |

\* cited by examiner

*Primary Examiner*—Derrish H. Banks
(74) *Attorney, Agent, or Firm*—Wenderoth, Lind & Ponack, L.L.P.

(57) ABSTRACT

The present invention relates to a substrate cleaning apparatus, and more particularly to a substrate cleaning apparatus suitable for cleaning a substrate which requires a high level of cleanliness, such as a semiconductor wafer, a glass substrate, a liquid crystal panel, etc. The substrate cleaning apparatus comprises a substrate holder for holding a substrate while rotating the substrate in a substantially horizontal plane, a cleaning device for scrubbing a surface to be cleaned of the substrate, a cleaning device holder for holding the cleaning device rotatably about its own axis, the cleaning device having a shaft and a cleaning member disposed around the shaft, the cleaning member being permeable to a cleaning liquid, the shaft having an axially extending shaft hole and a cleaning liquid ejection port extending radially therethrough from the shaft hole, and a fluid-lubricated bearing disposed between the shaft and the cleaning device holder in at least one end thereof and lubricated by a cleaning liquid as a lubricating fluid.

12 Claims, 9 Drawing Sheets

F I G. 1
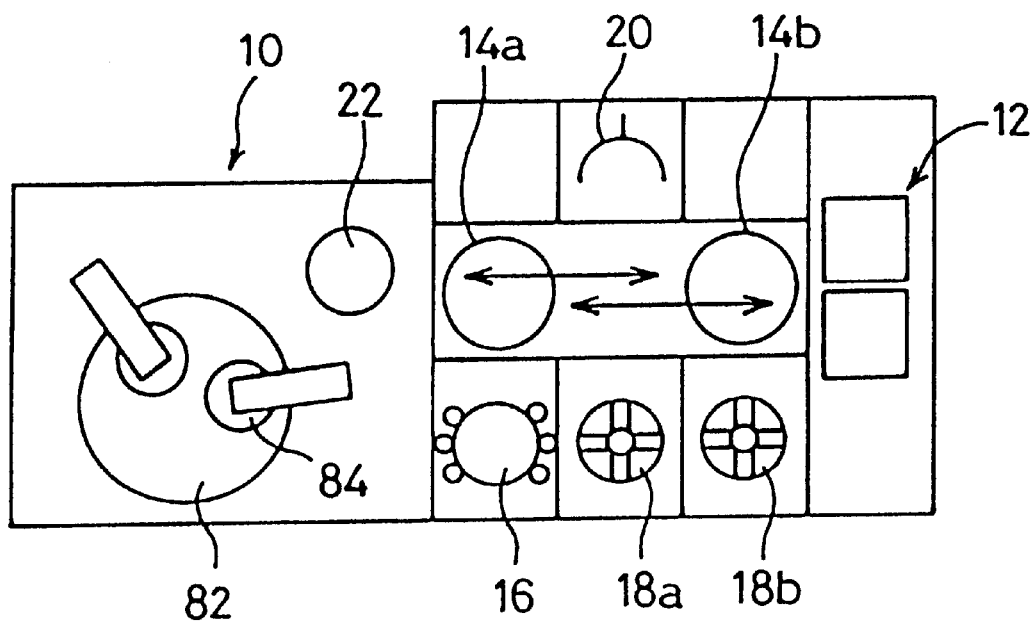

APPARATUS FOR CLEANING SUBSTRATE

BACKGROUND OF THE INVENTION

1. Field of the Invention

The present invention relates to a substrate cleaning apparatus, and more particularly to a substrate cleaning apparatus suitable for cleaning a substrate which requires a high level of cleanliness, such as a semiconductor wafer, a glass substrate, a liquid crystal panel, etc.

2. Description of the Related Art

Recent rapid progress in semiconductor device integration demands smaller and smaller wiring patterns or interconnections and also narrower spaces between interconnections which connect active areas. One of the processes available for forming such interconnection is photolithography. Though the photolithographic process can form interconnections that are spaced by a distance of at most 0.5 μm, it requires that surface on which pattern images are to be focused by a stepper is as flat as possible because the depth of focus of the optical system is relatively small. If particles larger than the distance between adjacent interconnections are present on a substrate, then they tend to cause a short circuit between the interconnections. Therefore, it is important that the substrate is cleaned as well as planarized in its fabrication process. The same processing requirements apply to other substrates including glass substrates, liquid crystal panels, etc. In view of these requirements, there has been a demand for cleaning techniques for removing smaller particles, i.e., submicrons, from semiconductor substrates or the like.

According to a known process of cleaning a polished semiconductor substrate to a high level of cleanliness, the surface to be cleaned of the substrate is scrubbed by a cleaning member such as a brush or a sponge that is rubbed against the substrate (primary cleaning), and then a stream of water under high pressure, i.e., a high-speed jet of water, is ejected toward the substrate to produce air bubbles due to cavitation to clean the substrate (secondary cleaning).

FIG. 9A of the accompanying drawings shows a conventional general arrangement of a substrate cleaning apparatus for use in scrubbing a substrate. The substrate cleaning apparatus has a plurality of upstanding substrate-holding rollers 100 openably and closably disposed around a substrate W. The substrate-holding rollers 100 has holding grooves 102 defined in upper ends thereof for holding the edge of the substrate W and rotating the substrate W upon rotation of the rollers 100. As shown in FIG. 9B of the accompanying drawings, a pair of cleaning devices 108 is disposed in sandwiching relationship to the substrate W. The cleaning devices 108 are rotatable about respective axes thereof and movable into and out of contact with the substrate W. Each of the cleaning devices 108 comprises a solid shaft 104 and a cleaning member 106 in the form of a tubular sponge, brush, or the like disposed on the surface of the solid shaft 104. As shown in FIG. 9C of the accompanying drawings, nozzles 110 which supply a cleaning liquid, pure water, or the like to the face and back of the substrate W are provided.

While the substrate W is being held and rotated by the rollers 100, the cleaning liquid is supplied from the nozzles 110 to the face and back of the substrate W, and the cleaning members 106 are rubbed against the substrate W to scrub the substrate W (primary cleaning) for thereby removing deposits of an abrasive liquid, a polishing residue, etc. from the entire face and back of the substrate W.

Since the scrubbing process is carried out while the cleaning members 106 are being held in contact with the substrate W, the contamination of the cleaning members 106 themselves governs the cleaning effect. If the contamination of the cleaning members 106 progresses, then the contaminant attached to the cleaning members 106 tends to contaminate the substrate W. Therefore, as shown in FIG. 9C, a cleaning tank 114 filled with a cleaning liquid 112 is disposed in a retracted position of the cleaning devices 108, and each of the cleaning devices 108 is cleaned by being dipped and rotated in the cleaning liquid 112 in the cleaning tank 114.

SUMMARY OF THE INVENTION

With the above conventional arrangement, it is necessary to supply the cleaning liquid to the entire surface of the substrate in order to uniformly clean the substrate, and hence a large amount of cleaning liquid is required. Particularly, if the substrate is rotated at a high speed, then the cleaning liquid is quickly removed from the surface of the substrate, and hence is utilized with low efficiency, resulting in a need for a greater amount of the cleaning liquid which is supplied from nozzles 110.

Furthermore, since the cleaning devices 108 are dipped in the cleaning liquid 112 in the cleaning tank 114 to clean the cleaning members 106 themselves, the cleaning devices 108 may be contaminated by contaminants contained in the cleaning liquid and ions released into the cleaning liquid.

The shafts 104 of the cleaning devices 108 are rotatably supported by bearings at ends held by the shaft end holders thereof remote from drive ends that are connected to a drive mechanism such as a motor. Therefore, particles are produced and metal and grease are released from the bearings, seals that protect the bearings from corrosive fluids, and springs which bias the cleaning devices in the axial direction. When not in operation, the cleaning liquid is dried to allow the cleaning agent to be solidified, preventing the cleaning devices from operating smoothly. Because the ends of the shafts held by the shaft end holders are combined with a complex mechanism, the diameter of the cleaning devices is so large that it takes a long period of time to impregnate the entire cleaning members of the cleaning devices with the cleaning liquid, and a large amount of cleaning liquid is required.

The present invention has been made in view of the above drawbacks. It is an object of the present invention to provide a substrate cleaning apparatus which has an increased cleaning efficiency of a cleaning liquid and maintains a sufficient cleaning capability, includes durable bearings of a simple structure, and can be operated stably at a low cost.

To achieve the above object, there is provided in accordance with an invention described in claim 1, a substrate cleaning apparatus comprising a substrate holder for holding a substrate while rotating the substrate in a substantially horizontal plane, a cleaning device for scrubbing a surface to be cleaned of the substrate, a cleaning device holder for holding the cleaning device rotatably about its own axis, the cleaning device having a shaft and a cleaning member disposed around the shaft, the cleaning member being permeable to a cleaning liquid, the shaft having an axially extending shaft hole and a cleaning liquid ejection port extending radially therethrough from the shaft hole, and a fluid-lubricated bearing disposed between the shaft and the cleaning device holder in at least one end thereof and lubricated by a cleaning liquid as a lubricating fluid. The cleaning member which is permeable to a cleaning liquid may be a sponge that is liquid-permeable by itself, a brush which has gaps, or a hydrophobic tube with holes defined at suitable intervals.

Since the cleaning liquid is ejected via the shaft hole in the shaft from the cleaning liquid ejection port and supplied via the cleaning member to the surface to be cleaned of the substrate, the cleaning liquid concentrates on a region to be cleaned of the substrate. Therefore, no wasteful cleaning liquid is supplied to the substrate, which is cleaned efficiently. Because the cleaning member itself is cleaned steadily by the cleaning liquid passing through the cleaning member, the substrate is prevented from being contaminated by the cleaning member which would otherwise be contaminated. Furthermore, inasmuch as the cleaning device is supported by the fluid-lubricated bearing which employs the cleaning liquid as the lubricating fluid, a stable contamination-free support structure of simple arrangement is achieved.

According to an invention described in claim 2, in the invention described in claim 1, the cleaning device holder has a shaft end holding member biased toward an end of the shaft, the shaft end holding member and the shaft having complementarily shaped abutting sliding surfaces. By guiding the cleaning liquid to the abutting sliding surfaces, a fluid-lubricated bearing which employs the cleaning liquid as a lubricating fluid is provided. The abutting sliding surfaces may usually be tapered surfaces, but may be arbitrary surfaces created by rotating quadratic curves or the like. The pressure between the abutting sliding surfaces can be adjusted by adjusting the biasing force of a spring or the like which urges the shaft end holding member.

According to an invention described in claim 3, in the invention described in claim 2, the abutting sliding surfaces are disposed at an open end of the shaft hole. With this arrangement, the cleaning liquid is supplied directly to the abutting sliding surfaces, not via a special passage.

According to an invention described in claim 4, in the invention described in claim 1, the fluid-lubricated bearing is made of a material which does not release metal ions into the cleaning liquid and is highly slidable. The fluid-lubricated bearing thus constructed provides a sliding assembly with good slidability and free of metal contamination.

The cleaning device may be arranged so as to be movable between a substrate cleaning position and a standby position, so that the cleaning device does not interfere when the substrate is fed. A cleaning tank having a cleaning liquid ejection nozzle may be disposed in the standby position of the cleaning device for cleaning the cleaning device itself.

According to an invention described in claim 5, in the invention described in claim 1, the cleaning device holder has a shaft end holding member biased toward an end of the shaft, the shaft end holding member housing therein a centering pusher rotatable in unison with the cleaning device and rotatably supported by a roller bearing. The cleaning liquid is introduced into the roller bearing disposed in the shaft end holding member, thus providing a fluid-lubricated bearing that employs the cleaning liquid as a lubricating fluid. Since the centering pusher is rotatably supported by the roller bearings, particles are prevented from being produced which would otherwise occur due to sliding movement between the centering pusher and the cleaning device.

According to an invention described in claim 6, in the invention described in claim 5, the roller bearing is made of a material which does not release metal ions into the cleaning liquid and/or an etching liquid and does not produce particles. The roller bearing may comprise a ceramics bearing, and may be made of ceramics, Teflon, or the like. Therefore, metal contamination and particles are prevented from being produced by the roller bearings.

According to an invention described in claim 7, there is provided an apparatus for polishing a substrate, comprising a substrate housing unit, a substrate polishing assembly, a substrate cleaning apparatus according to any one of claims 1 through 6, and a substrate feeding mechanism for feeding a substrate between the substrate housing unit, the substrate polishing assembly, and the substrate cleaning apparatus.

BRIEF DESCRIPTION OF THE DRAWINGS

FIG. 1 is a view showing an overall arrangement of a polishing apparatus according to an embodiment of the present invention;

DETAILED DESCRIPTION OF THE PREFERRED EMBODIMENTS

Figure 2A:
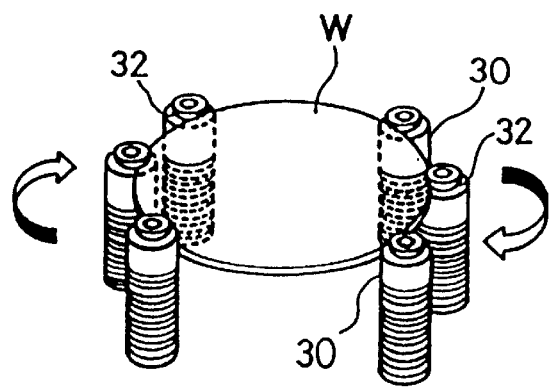
FIG. 2A is a perspective view showing a general arrangement of a substrate cleaning apparatus according to an embodiment of the present invention.

Embodiments of the present invention will be described below with reference to the drawings. FIG. 1 is a view showing a polishing apparatus according to an embodiment of the present invention. The polishing apparatus comprises a polishing assembly 10 having a single polishing machine, a loading/unloading unit 12, two feeding machines 14a, 14b, a substrate cleaning apparatus 16 for primary cleaning, two substrate cleaning apparatuses 18a, 18b for secondary cleaning, and a reversing machine 20. The polishing assembly 10 and the substrate cleaning apparatus 16, 18a, 18b are in the form of units separated by partitions, and are evacuated independently of each other so that their atmospheres will not interfere with each other.

Figure 2B:
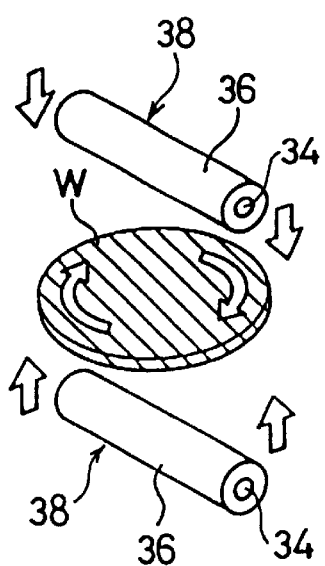
FIGS. 2B and 2C are views illustrative of the manner in which the substrate cleaning apparatus operates.
Figure 2C:
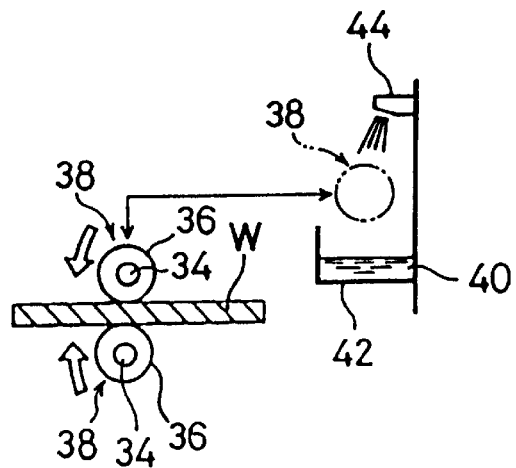

As shown in FIG. 2A, the substrate cleaning apparatus 16 for primary cleaning comprises a plurality of upstanding substrate-holding rollers 30 openably and closably disposed around a substrate W. The substrate-holding rollers 30 has holding grooves 32 defined in upper ends thereof for holding the edge of the substrate W and rotating the substrate W upon rotation of the rollers 30. As shown in FIG. 2B, a pair of cleaning devices 38 is disposed in sandwiching relationship to the substrate W. The cleaning devices 38 are rotatable about respective axes thereof and movable into and out of contact with the substrate W. Each of the cleaning devices 38 comprises a solid shaft 34 and a cleaning member 36 in the form of a tubular sponge, brush, or the like disposed on the surface of the solid shaft 34. As shown in FIG. 2C, a cleaning tank 42 filled with a cleaning liquid 40 is disposed and a cleaning liquid nozzle 44 is disposed above the cleaning tank 42.

Figure 3:
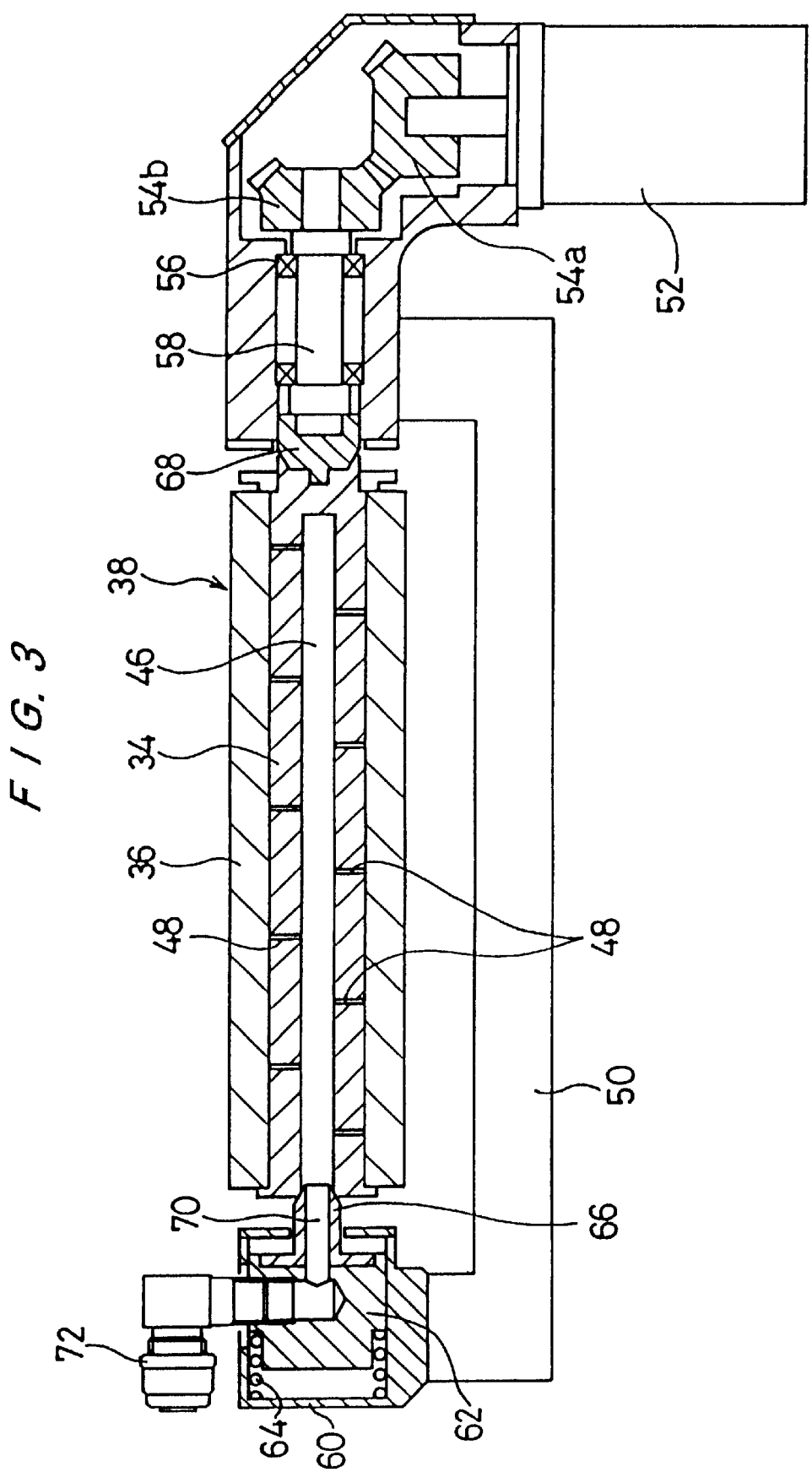
FIG. 3 is a front elevational view, partly in cross section, of the substrate cleaning apparatus shown in FIG. 2.

As shown in FIG. 3, the shaft 34 has a shaft hole 46 extending axially substantially the full length of the shaft 34. The shaft hole 46 is closed at an end that is coupled to a driver of the shaft 34 and open at an opposite end with an outward taper. To the shaft hole 46, there are formed a plurality of cleaning liquid ejection ports 48 extending radially and having ends open at the outer surface of the shaft 34. The cleaning liquid ejection ports 48 are spaced in the axial direction. The shaft 34 is made of a material having predetermined flexibility, slidability, and corrosion resistance, such as Teflon, for example.

The cleaning device 38 has both ends supported by a frame 50 extending parallel thereto. When the frame 50 is vertically moved by a support mechanism (not shown), the cleaning device 38 can be brought into and out of contact with the substrate W. A motor 52 and a pair of bevel gears 54a, 54b for converting the direction of rotary output power of the motor 52 into a horizontal direction are disposed at the end of the frame 50. The driven bevel gear 54b is fixed to a transmission shaft 58 that is supported by a bearing 56. The transmission shaft 58 is coupled to the closed end of the shaft 34 of the cleaning device 38 by a coupling 68, for rotating the cleaning device 38 upon rotation of the motor 52.

A box-shaped shaft end holder 60 is attached to the other end of the frame 50. The shaft end holder 60 houses therein a shaft end holding member 62 that is slidable toward the transmission shaft 58 but locked against rotation. The shaft end holding member 62 has a centering pusher 66 having a tapered portion on its distal end. The centering pusher 66 has a shank projecting from a hole defined in the shaft end holder 60. A helical compression spring 64 is disposed between the shaft end holding member 62 and a rear wall of the shaft end holder 60 for normally urging the shaft end holding member 62 toward the transmission shaft 58. The shaft end holding member 62 is pressed toward the transmission shaft 58 under the bias of the helical compression spring 64, inserting the tapered portion of the centering pusher 66 into the shaft hole 46 in the shaft 34 for thereby centering the shaft 34 and supporting the cleaning device 38.

The centering pusher 66 of the shaft end holding member 62 is made of a material which is highly hard and does not release metal ions, such as ceramics, for example. The shaft 34 is made of Teflon, for example, as described above. Therefore, the centering pusher 66 and the shaft 34 make up a sliding assembly in which they are well slidable against each other, and which is highly resistant to chemicals and free of metal contamination.

Figure 4:
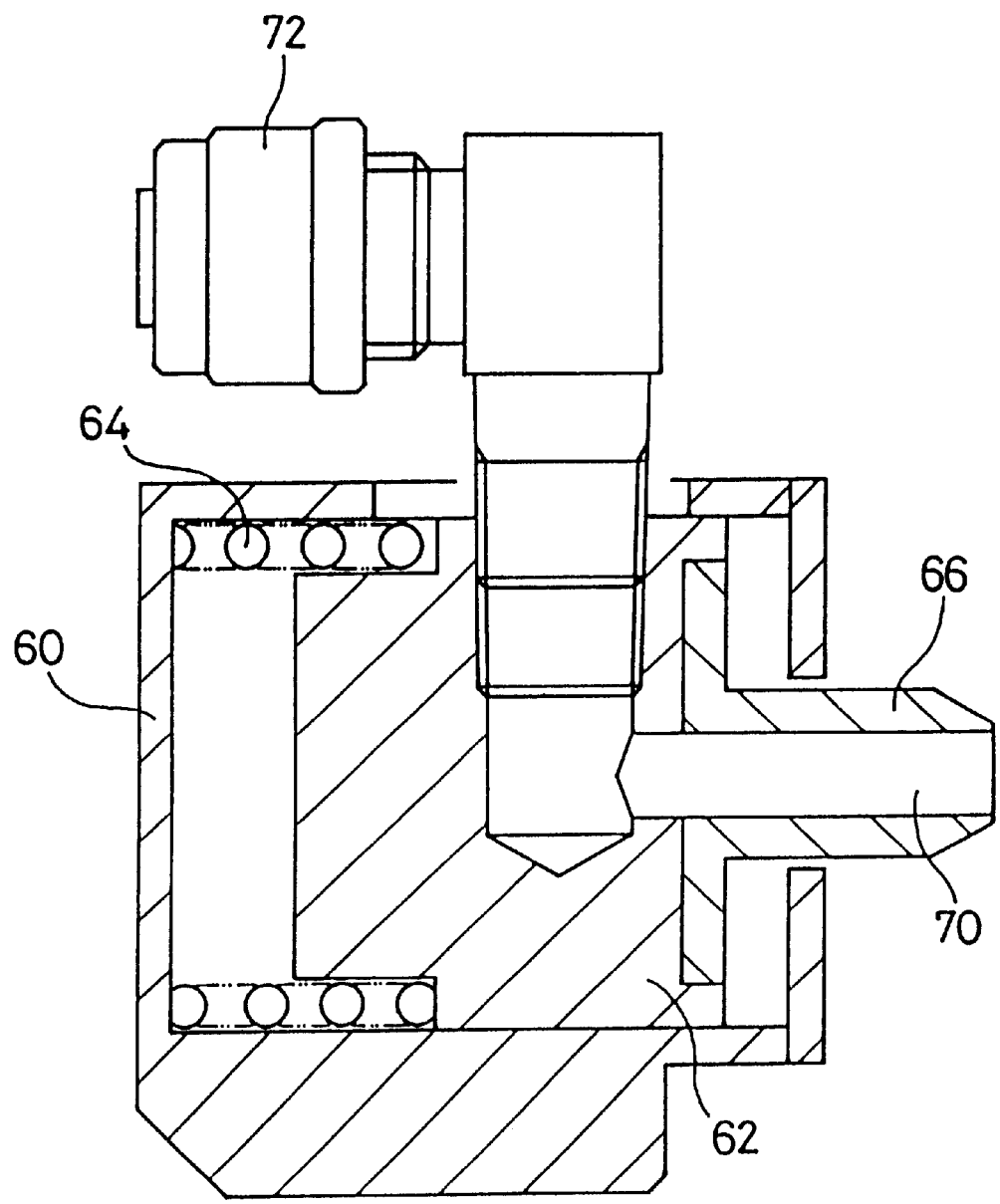
FIG. 4 is an enlarged view of a portion shown in FIG. 3.

The shaft end holding member 62 has a cleaning liquid passage 70 that opens at the distal end of the centering pusher 66. As shown in FIG. 4, a cleaning liquid supply joint 72 that communicates with the cleaning liquid passage 70 is attached to an upper end of the shaft end holding member 62. A cleaning liquid that is supplied from a pipe or the like connected to the cleaning liquid supply joint 72 flows from the cleaning liquid passage 70 into the shaft hole 46 in the shaft 34 of the cleaning device 38, and is ejected from the cleaning liquid ejection ports 48. The cleaning liquid supply joint 72 is flexible so as not to block axial movement of the shaft end holding member 62. The cleaning device 38 can be moved toward the shaft end holding member 62 and detached from the coupling 68 for easy replacement.

Figure 5:
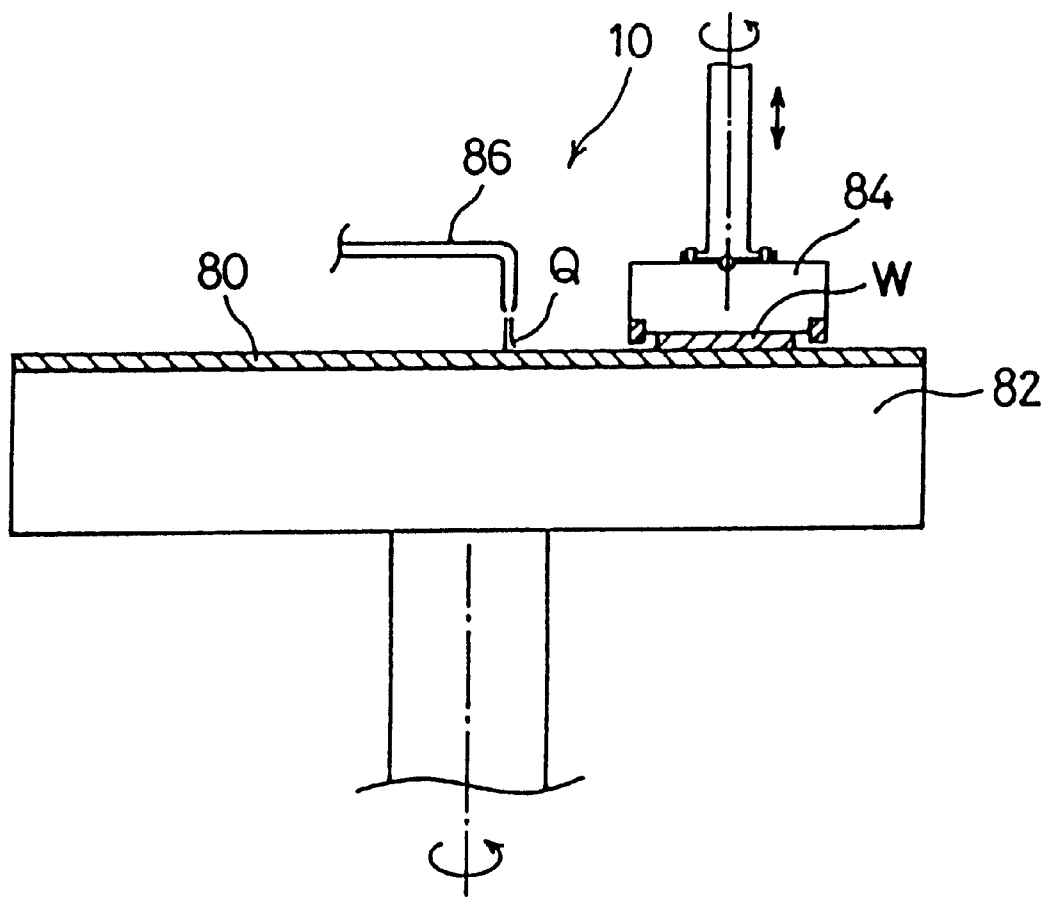
FIG. 5 is a cross-sectional view of a polishing assembly.

As shown in FIG. 5, the polishing assembly 10 comprises a polishing table 82 with a cloth (polishing cloth) 80 attached to an upper surface thereof, a top ring 84 for holding and pressing a semiconductor wafer (substrate) W against the polishing table 82, and an abrasive liquid nozzle 86 for supplying an abrasive liquid Q between the cloth 80 and the substrate W.

Figure 6A:
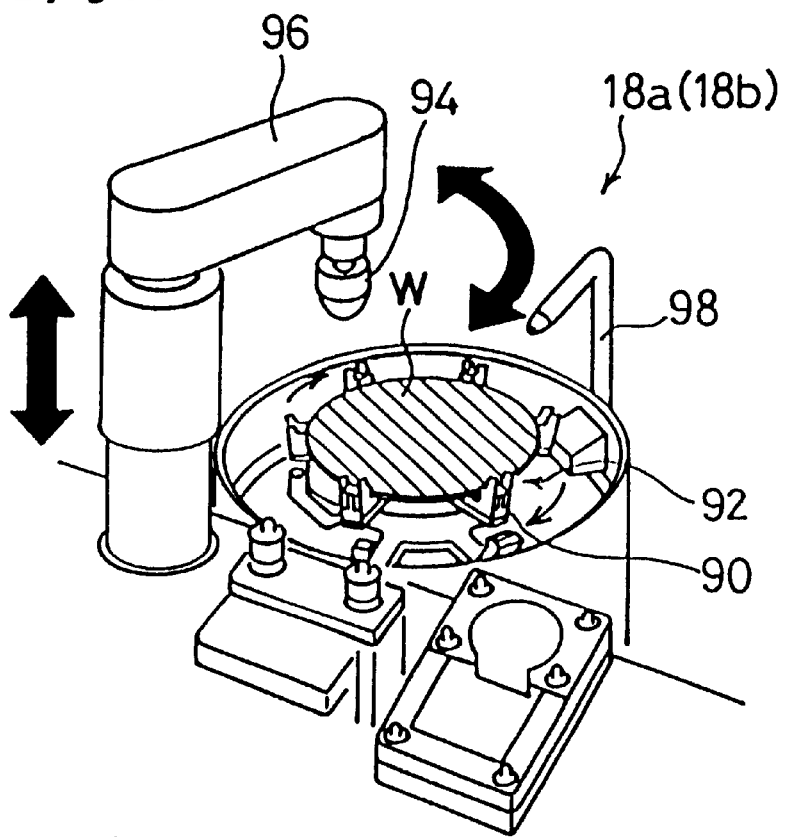
FIG. 6A is a perspective view of a substrate cleaning apparatus for secondary cleaning.
Figure 6B:
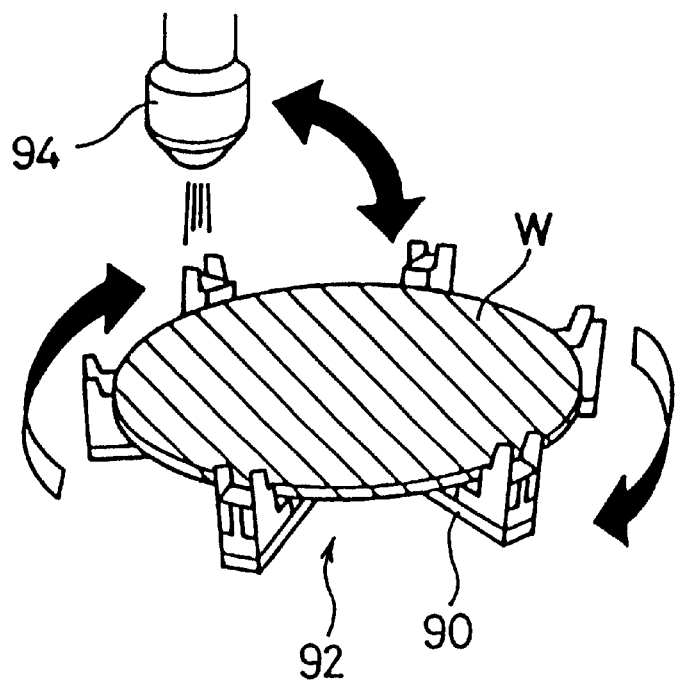
FIG. 6B is a view illustrative of the manner in which the substrate cleaning apparatus for secondary cleaning operates.

As shown in FIG. 6, each of the substrate cleaning apparatus 18a, 18b for secondary cleaning comprises a cleaning machine of the high-speed-rotation type having a turntable 92 comprising radial arms 90 mounted on the upper end of a rotatable shaft for gripping the substrate W. The cleaning machine is rotatable at a high speed ranging from 1500 to 5000 r.p.m. Each of the substrate cleaning apparatus 18a, 18b has a swing arm 96 having a cleaning liquid nozzle 94 for supplying a cleaning liquid that is ultrasonically vibrated onto the upper surface of the substrate W. Each of the substrate cleaning apparatus 18a, 18b also has a nozzle 98 for supplying an inactive gas for increasing the process performance and shortening the tact time.

Operation of the polishing apparatus shown in FIG. 1 will be described below. The substrate W which is supplied from the loading/unloading unit 12 via the reversing machine 20 to the polishing assembly 10 is supplied with the abrasive liquid Q from the abrasive liquid nozzle 86. At the same time, the polishing table 82 and the top ring 84 are rotated, and the substrate W is normally polished by being pressed against the cloth 80. Thereafter, pure water is used as an abrasive liquid to polish the substrate W with water under a pressure lower than the pressure in the normal polishing stage and/or at a speed lower than the speed in the normal polishing stage. In the water polishing stage, small scratches produced on the polished surface of the substrate W in the normal polishing stage are reduced, and at the same time a polishing residue and abrasive particles that remain on the polished surface are removed. Instead of the water polishing stage, or between the normal polishing stage and the water polishing stage, the substrate W may be cleaned with an abrasive liquid containing abrasive particles of smaller diameter than those used in the normal polishing stage.

The polished substrate W is fed via a substrate transfer table 22 to the substrate cleaning apparatus 16 for primary cleaning by the feeding machines 14a, 14b, and held by the rollers 30 of the substrate cleaning apparatus 16. The rollers 30 are then rotated to rotate the substrate W, while at the same time the cleaning devices 38 are moved from standby positions to cleaning positions. In the cleaning position, the motors 52 are energized to rotate the cleaning devices 38, and the cleaning members 36 are rubbed against the face and back of the substrate W to scrub the substrate W (primary cleaning).

The cleaning liquid is supplied from a cleaning liquid source under a predetermined pressure via the cleaning liquid supply joint 72 into the cleaning liquid passage 70 in the shaft end holding member 62, flows from the tip end of the centering pusher 66 into the shaft hole 46 in the shaft 34, and is ejected from the cleaning liquid ejection ports 48. The cleaning liquid enters into the cleaning members 36 and oozes out of its surface and is supplied to the surface to be cleaned of the substrate W. Since the cleaning liquid is supplied to only the region of the surface of the substrate W which needs and effectively uses the cleaning liquid, the substrate W can efficiently cleaned. For example, the same cleaning effect can be achieved even if the amount of cleaning liquid is used from 30 to 50 percent smaller than the amount of cleaning liquid that has heretofore been used. The cleaning members 36 are prevented from being contaminated because the cleaning liquid that oozes out of the cleaning members 36 steadily removes contaminants attached to the cleaning members 36.

Part of the cleaning liquid supplied to each of the cleaning devices 38 flows out of the gap between the tapers between the centering pusher 66 of the shaft end holding member 62 and the shaft 34, thus providing a fluid-lubricated bearing that is lubricated by the cleaning liquid, so that the cleaning device 38 can stably be supported by a simple structure without producing contaminants. Insofar as the pressure in the cleaning liquid in the shaft hole 46 is higher than the external pressure, no particles go into the cleaning liquid, and hence the cleaning liquid is not contaminated. Because the shaft 34 is made of Teflon and the centering pusher 66 of the shaft end holding member 62 is made of ceramics, there is provided a sliding assembly in which they are well slidable against each other, and which is highly resistant to chemicals and free of metal contamination.

After the substrate W has been scrubbed (primary cleaning), the cleaning devices 38 are retracted to the retracted positions where the cleaning liquid is ejected from the cleaning liquid nozzle 44 to the cleaning device 38 and the cleaning device 38 is simultaneously rotated to clean the cleaning member 36, regularly or if necessary. Since the cleaning device 38 is not dipped in the cleaning liquid, the cleaning device 38 is prevented from being contaminated by contact with the cleaning liquid which would otherwise be contaminated. At this time, the cleaning liquid may be introduced from the shaft end holding member 62 into the shaft hole 46 in the shaft 34 and ejected from the cleaning liquid ejection ports 48 for increased cleaning efficiency.

After the primary cleaning, the substrate W is supplied with pure water or the like, and then delivered to the substrate cleaning apparatus 18a or 18b for secondary cleaning. In the substrate cleaning apparatus 18a or 18b, the substrate W is gripped by the arms 90 of the turntable 92, and rotated at a low speed ranging from about 100 to 500 r.p.m. At the same time, the swing arm 96 is angularly moved over the entire surface of the substrate W and ultrasonically vibrated pure water is supplied from the cleaning liquid nozzle 94 on the distal end of the swing arm 96 to clean the surface of the substrate W (secondary cleaning). The supply of the pure water is stopped, and the swing arm 96 is moved to a standby position, after which the rotational speed of the substrate W is changed to a higher rotational speed ranging from 1500 to 5000 $min^{-1}$. While a clean inactive gas is being supplied, if necessary, the substrate W is dried. The substrate W which has been cleaned and dried is returned to the loading/unloading unit 12 by clean hands of the feeding machines 14a, 14b.

Figure 7:
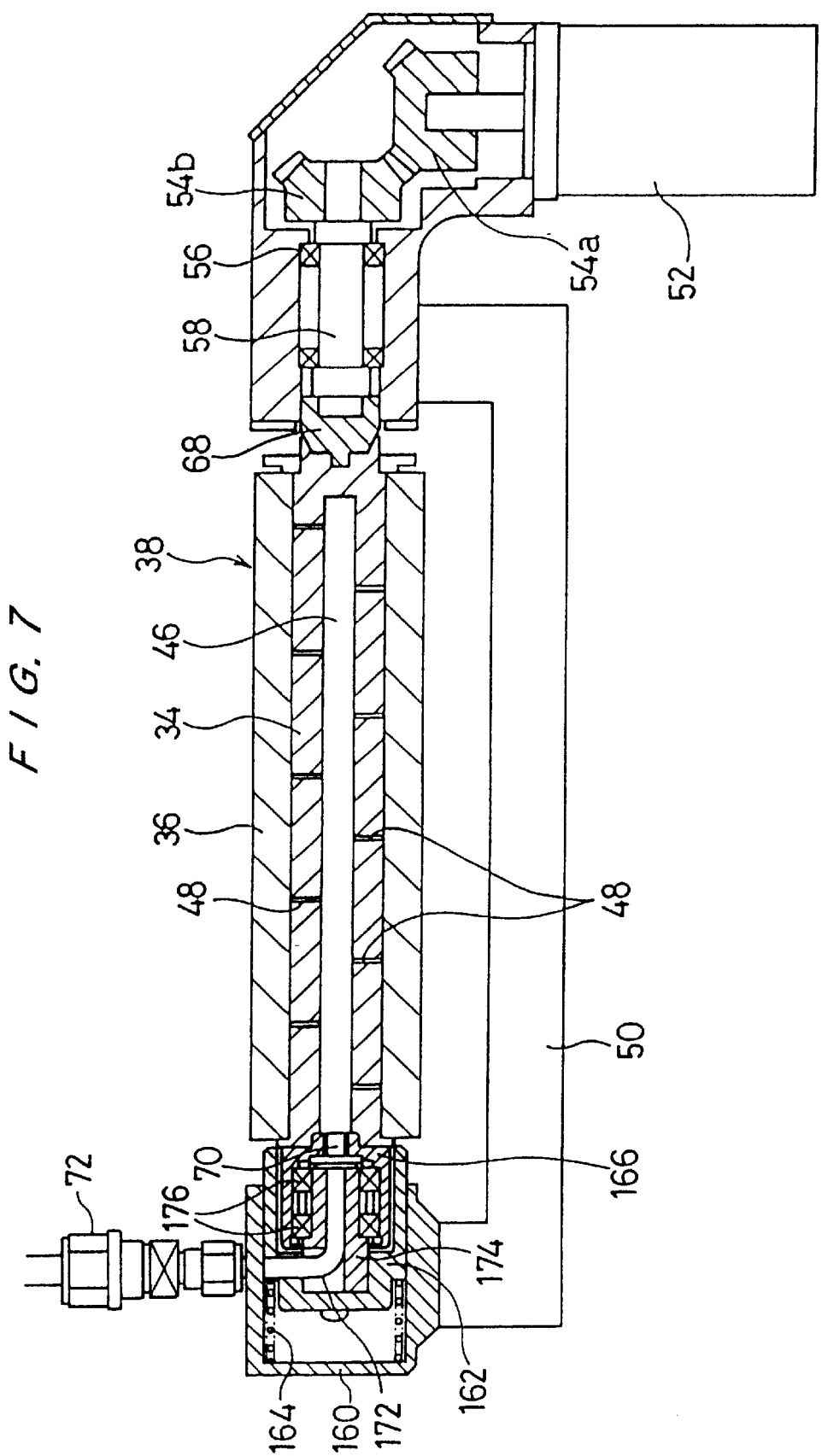
FIG. 7 is a front elevational view, partly in cross section, of a substrate cleaning apparatus according to another embodiment of the present invention.
Figure 8:
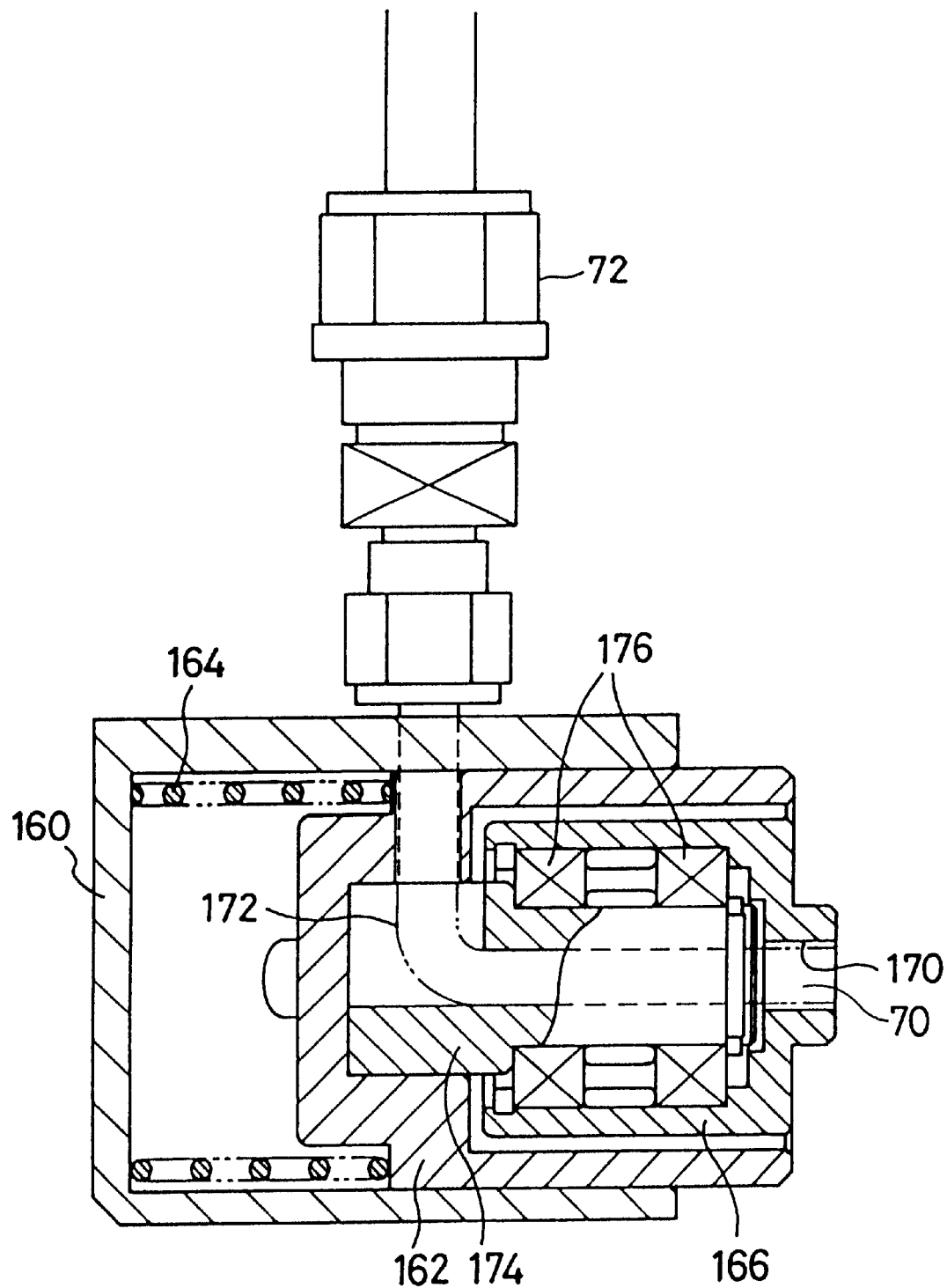
FIG. 8 is an enlarged view of a portion shown in FIG. 7.
Figure 9A:
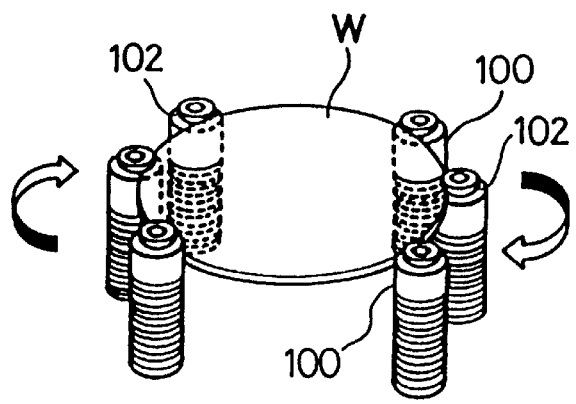
FIG. 9A is a perspective view showing a general arrangement of a conventional substrate cleaning apparatus.
Figure 9B:
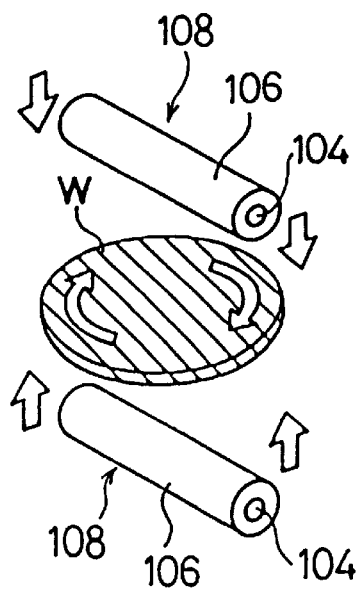
FIGS. 9B and 9C are views illustrative of the manner in which the conventional substrate cleaning apparatus operates.
Figure 9C:
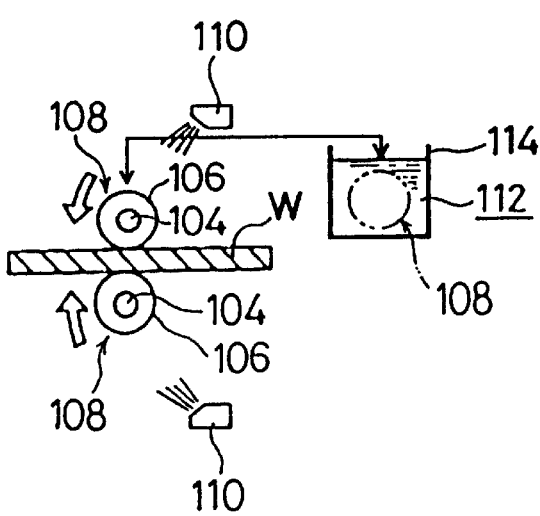

FIGS. 7 and 8 show a substrate cleaning apparatus according to another embodiment of the present invention. The substrate cleaning apparatus according to the other embodiment differs from the substrate cleaning apparatus according to the previous embodiment as follows:

A box-shaped shaft end holder 160 which is open on one side is attached to the other end of the frame 50. The shaft end holder 160 houses therein a shaft end holding member 162 that is slidable toward the transmission shaft 58 but locked against rotation. A helical compression spring 164 is disposed between the shaft end holding member 162 and a rear wall of the shaft end holder 160 for normally urging the shaft end holding member 162 toward the transmission shaft 58. The shaft end holding member 162 houses therein a tube holder 174 with its ends fixed in position. The tube holder 174 holds a tube 172 that is bent at a right angle and extends from the cleaning liquid supply joint 72. A centering pusher 166 is rotatably supported on a shaft of the tube holder 174 by a pair of roller bearings 176 within the shaft end holding member 162. The centering pusher 166 has a shank fitted in a large-diameter hole in the end of the shaft hole 46 in the shaft 34. The centering pusher 166 and the shaft end holding member 162 are pushed toward the transmission shaft 58 by the helical compression spring 164, the shank of the centering pusher 166 fits in the large-diameter hole in the end of the shaft hole 46 in the shaft 34 thereby to support the cleaning device 38. When the motor 52 is energized to rotate the cleaning device 38, the centering pusher 166 is rotated in unison with the shaft 34 while being supported by the roller bearings 176.

The shaft end holding member 162 has the cleaning liquid passage 70 that opens at the distal end of the centering pusher 166. The tube 172 extends in the tube holder 174 to the open end of the cleaning liquid passage 70.

In the substrate cleaning apparatus according to the other embodiment, the cleaning liquid flows from a cleaning liquid source under a predetermined pressure via the cleaning liquid supply joint 72 and the tube 172 into the shaft hole 46 in the shaft 34. Part of the cleaning liquid supplied to the cleaning device 38 flows out of a gap 170 between the cleaning liquid passage 70 in the centering pusher 166 and the tube 172, thus providing a fluid-lubricated bearing that is lubricated by the cleaning liquid, so that the cleaning device 38 can stably be supported by a simple structure without producing contaminants.

With the substrate cleaning apparatus according to the other embodiment, the cleaning liquid is introduced into the roller bearings 176 disposed in the shaft end holding member 162, thus providing a fluid-lubricated bearing that is lubricated by the cleaning liquid. Since the centering pusher 166 is rotatably supported by the roller bearings 176, particles are prevented from being produced which would otherwise occur due to sliding movement between the centering pusher 166 and the cleaning device 38.

The roller bearings 176 should preferably be made of a material which does not release metal ions into the cleaning liquid and etching liquids and does not produce particles. For example, the roller bearings 176 may comprise ceramics bearings, and may be made of ceramics, Teflon, or the like. Therefore, metal contamination and particles are prevented from being produced by the roller bearings 176.

According to the present invention, as described above, since the cleaning liquid oozes out of the cleaning member and is supplied to the surface to be cleaned of the substrate so as to concentrate on a region to be cleaned, the substrate is cleaned without wasting the cleaning liquid. Because the cleaning member itself is cleaned steadily by the cleaning liquid passing through the cleaning member, the substrate is prevented from being contaminated by the cleaning member which would otherwise be contaminated. Furthermore, inasmuch as the cleaning device is supported by the fluid-lubricated bearing which employs the cleaning liquid as the lubricating fluid, the diameter of the cleaning device may be reduced. Thus, a replacement speed for switching from a chemical to pure water or from pure water to a chemical can be increased. For example, when pure water used to prevent the cleaning device from becoming dry is switched to a chemical for etching or cleaning the substrate, the pure water in the cleaning device is quickly replaced with the chemical for stable performance. Moreover, a stable contamination-free support structure of simple arrangement is achieved, providing a substrate cleaning apparatus which is stable and operable at a low cost.

What is claimed is:

1. A substrate cleaning apparatus comprising:
   a substrate holder for holding a substrate while rotating the substrate in a substantially horizontal plane;
   a cleaning device for scrubbing a surface to be cleaned of said substrate;
   a cleaning device holder for holding said cleaning device rotatably about its own axis;
   said cleaning device having a shaft and a cleaning member disposed around said shaft, said cleaning member being permeable to a cleaning liquid;
   said shaft having an axially extending shaft hole and a cleaning liquid ejection port extending radially therethrough from said shaft hole; and
   a fluid-lubricated bearing disposed between said shaft and said cleaning device holder in at least one end thereof and lubricated by said cleaning liquid as a lubricating fluid.

2. A substrate cleaning apparatus according to claim 1, wherein said cleaning device holder has a shaft end holding member biased toward an end of said shaft, said shaft end holding member and said shaft having complementarily shaped abutting sliding surfaces.

3. A substrate cleaning apparatus according to claim 2, wherein said abutting sliding surfaces are disposed at an open end of said shaft hole.

4. An apparatus for polishing a substrate comprising:
   a substrate housing unit,
   a substrate polishing assembly,
   a substrate cleaning apparatus according to claim 3, and
   a substrate feeding mechanism for feeding a substrate between the substrate housing unit, the substrate polishing assembly, and the substrate cleaning apparatus.

5. An apparatus for polishing a substrate comprising:
   a substrate housing unit,
   a substrate polishing assembly,
   a substrate cleaning apparatus according to claim 2, and
   a substrate feeding mechanism for feeding a substrate between the substrate housing unit, the substrate polishing assembly, and the substrate cleaning apparatus.

6. A substrate cleaning apparatus according to claim 1, wherein said fluid-lubricated bearing is made of a material which does not release metal ions into said cleaning liquid and is highly slidable.

7. An apparatus for polishing a substrate comprising:
   a substrate housing unit,
   a substrate polishing assembly,
   a substrate cleaning apparatus according to claim 6, and
   a substrate feeding mechanism for feeding a substrate between the substrate housing unit, the substrate polishing assembly, and the substrate cleaning apparatus.

8. A substrate cleaning apparatus according to claim 1, wherein said cleaning device holder has a shaft end holding member biased toward an end of said shaft, said shaft end holding member housing therein a centering pusher rotatable in unison with said cleaning device and rotatably supported by a roller bearing.

9. A substrate cleaning apparatus according to claim 8, wherein said roller bearing is made of a material which does not release metal ions into said cleaning liquid and/or an etching liquid and does not produce particles.

10. An apparatus for polishing a substrate comprising:
    a substrate housing unit,
    a substrate polishing assembly,
    a substrate cleaning apparatus according to claim 9, and
    a substrate feeding mechanism for feeding a substrate between the substrate housing unit, the substrate polishing assembly, and the substrate cleaning apparatus.

11. An apparatus for polishing a substrate comprising:
    a substrate housing unit,
    a substrate polishing assembly,
    a substrate cleaning apparatus according to claim 8, and
    a substrate feeding mechanism for feeding a substrate between the substrate housing unit, the substrate polishing assembly, and the substrate cleaning apparatus.

12. An apparatus for polishing a substrate comprising:
    a substrate housing unit,
    a substrate polishing assembly,
    a substrate cleaning apparatus according to claim 1, and
    a substrate feeding mechanism for feeding a substrate between the substrate housing unit, the substrate polishing assembly, and the substrate cleaning apparatus.

* * * * *